United States Patent
Ma et al.

(10) Patent No.: US 8,232,638 B2
(45) Date of Patent: Jul. 31, 2012

(54) INTERCONNECTION STRUCTURE HAVING OXYGEN TRAP PATTERN IN SEMICONDUCTOR DEVICE

(75) Inventors: Young-Tae Ma, Gyeonggi-do (KR); In-Sun Park, Seoul (KR); Dong-Jo Kang, Gyeonggi-do (KR); Hyun-Seok Lim, Gyeonggi-do (KR); Do-Hyung Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 413 days.

(21) Appl. No.: 12/195,315

(22) Filed: Aug. 20, 2008

(65) Prior Publication Data

US 2009/0053538 A1     Feb. 26, 2009

(30) Foreign Application Priority Data

Aug. 24, 2007     (KR) ........................ 10-2007-0085455

(51) Int. Cl.
    *B32B 15/00*     (2006.01)
(52) U.S. Cl. .......................... 257/734; 257/773; 257/744
(58) Field of Classification Search .................. 257/734, 257/773, 774
    See application file for complete search history.

(56) References Cited

U.S. PATENT DOCUMENTS

| | | | | |
|---|---|---|---|---|
| 6,433,429 B1 * | 8/2002 | Stamper | ..................... | 257/751 |
| 6,674,170 B1 * | 1/2004 | Ngo et al. | ..................... | 257/774 |
| 6,887,795 B2 * | 5/2005 | Soininen et al. | .............. | 438/722 |
| 7,745,327 B2 * | 6/2010 | Preusse et al. | ................ | 438/627 |
| 2003/0160333 A1 * | 8/2003 | Kim et al. | ..................... | 257/774 |
| 2005/0077627 A1 * | 4/2005 | Yu et al. | ........................ | 257/751 |
| 2006/0261478 A1 * | 11/2006 | Thei et al. | .................... | 257/751 |

FOREIGN PATENT DOCUMENTS

| | | | |
|---|---|---|---|
| JP | 11-111842 | * | 4/1999 |
| KR | 1995-0021071 | | 7/1995 |
| KR | 1996-0032644 | | 9/1996 |
| KR | 1997-0052297 | | 7/1997 |
| KR | 1998-0005421 | | 3/1998 |
| KR | 10-1999-0059100 | | 7/1999 |
| KR | 10-2006-0072409 | | 6/2006 |

* cited by examiner

*Primary Examiner* — Matthew W Such
*Assistant Examiner* — David Spalla
(74) *Attorney, Agent, or Firm* — Volentine & Whitt, PLLC

(57) ABSTRACT

An interconnection structure having an oxygen trap pattern in a semiconductor device, and a method of fabricating the same are provided. The interconnection structure includes a lower interlayer insulating layer formed on a semiconductor substrate. A metal layer pattern and a capping layer pattern are sequentially stacked on the lower interlayer insulating layer. An oxygen trap pattern is disposed on the capping layer pattern and includes a conductive oxygen trap pattern.

17 Claims, 10 Drawing Sheets

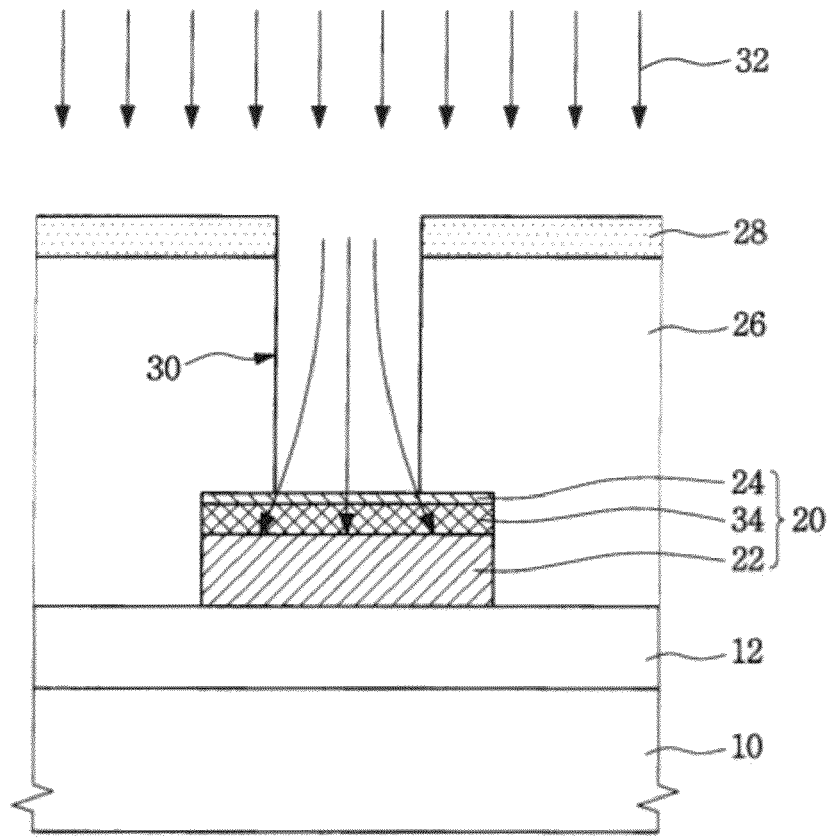

INTERCONNECTION STRUCTURE HAVING OXYGEN TRAP PATTERN IN SEMICONDUCTOR DEVICE

CROSS-REFERENCE TO RELATED APPLICATION

This application claims the benefit of Korean Patent Application No. 2007-85455, filed Aug. 24, 2007, the disclosure of which is hereby incorporated herein by reference in its entirety.

BACKGROUND

1. Field of the Invention

Embodiments of the present invention relate to a semiconductor device and a method of fabricating the same, and more particularly, to an interconnection structure having an oxygen trap pattern in a semiconductor device, and a method of fabricating the same.

2. Description of the Related Art

Generally, semiconductor devices include an integrated circuit composed of discrete devices such as transistors, resistors and capacitors. The discrete devices may be electrically connected to each other through interconnections provided in an interlayer insulating layer. As the semiconductor devices are highly integrated, the size of the interconnections is also downscaled. Due to such a trend, the interconnections require various characteristics. One of the required characteristics is high conductivity. High conductivity helps to prevent signal delay typically caused by high resistance of the interconnection. For this reason, recent trends are toward the use of interconnections that are formed of metal, for example, aluminum or tungsten.

FIGS. 1A to 1C are cross-sectional views illustrating a method of fabricating a conventional interconnection structure.

Referring to FIG. 1A, a lower interlayer insulating layer 12 may be formed on a semiconductor substrate 10. A lower metal layer and a capping layer may be sequentially stacked on the lower interlayer insulating layer 12. The lower metal layer may be formed of aluminum or an aluminum alloy. Further, the capping layer may be formed of titanium nitride. Subsequently, the capping layer and the lower metal layer may be continuously patterned so that a lower metal layer pattern 22 and a capping layer pattern 24 can be formed. As a result, a lower metal interconnection 20 including the lower metal layer pattern 22 and the capping layer pattern 24, which are sequentially stacked, may be formed.

Then, an upper interlayer insulating layer 26 may be formed on the entire surface of the semiconductor substrate 10 having the lower metal interconnection 20. A photoresist pattern 28 having an opening exposing a predetermined region of the upper interlayer insulating layer 26 may be formed. The upper interlayer insulating layer 26 may be etched using the photoresist pattern 28 as an etch mask to form a via contact hole 30 exposing the capping layer pattern 24.

Referring to FIG. 1B, the photoresist pattern 28 is removed. The photoresist pattern 28 may be removed by an ashing process. The ashing process may be performed using an oxygen gas 32 or an ozone gas in addition to plasma to remove the photoresist pattern 28. The oxygen gas 32 penetrates into the exposed capping layer pattern 24. If the capping layer pattern 24 is formed of a titanium nitride layer, the titanium nitride layer 24 may have vertical grains. Accordingly, the oxygen gas 32 may penetrate into an interface between the titanium nitride layer 24 and the lower metal layer pattern 22 along grain boundaries of the titanium nitride layer 24. The oxygen gas 32 diffuses into the layers formed at both sides of the interface, thereby forming an interfacial oxide layer 34 such as an aluminum titanium oxynitride (AlTiON) layer at the interface. The interfacial oxide layer 34 is a quaternary oxide layer, which generally has high specific resistance.

Referring to FIG. 1C, an upper metal layer may be formed on the semiconductor substrate 10 having the via contact hole 30. The upper metal layer may form a contact plug 36, which is electrically in contact with the lower metal interconnection 20 as a result of the upper metal layer filling the via contact hole 30. Then, the upper metal layer disposed on the upper interlayer insulating layer 26 may be patterned to form an upper metal interconnection 38.

According to the conventional technique, a contact resistance between the contact plug 36 and the lower metal interconnection 20 increases due to the interfacial oxide layer 34. Accordingly, current flowing from the upper metal interconnection 38 to the lower metal interconnection 20 is hindered by the interfacial oxide layer 34. Further, in a subsequent annealing process, the oxygen remaining in the titanium nitride layer 24 may diffuse to the interface causing the interfacial oxide layer 34 to be formed thicker. Due to the high resistance of the interfacial oxide layer 34, the current between the upper and lower metal interconnections 38 and 20 may be interrupted. In addition, resistance of the lower metal interconnection 20 itself may also increase. Consequently, the reliability of the semiconductor device is degraded.

SUMMARY OF THE INVENTION

An example embodiment of the invention provides an interconnection structure in a semiconductor device, which can enhance the reliability of the semiconductor device by reducing contact resistance.

Another example embodiment of the invention provides a method of fabricating an interconnection structure in a semiconductor device, which can enhance the reliability of the semiconductor device by reducing contact resistance.

In one aspect, the invention is directed to an interconnection structure in a semiconductor device. The interconnection structure may include a lower interlayer insulating layer formed on a semiconductor substrate. A metal layer pattern and a capping layer pattern are provided, which may be sequentially stacked on the lower interlayer insulating layer. An oxygen trap pattern is provided, which may be disposed on the capping layer pattern and includes a conductive oxygen trap pattern.

In some example embodiments of the invention, the conductive oxygen trap pattern may include a layer of metal which can trap oxygen by reacting with the oxygen. The conductive oxygen trap pattern may include at least one of a titanium layer, a vanadium layer, a chromium layer, a cobalt layer, a nickel layer, a hafnium layer, a tungsten layer, an iridium layer, a platinum layer, a tantalum layer and a tin layer. The oxygen trap pattern may include a trapping nitride layer pattern disposed on the conductive oxygen trap pattern. The conductive oxygen trap pattern and the trapping nitride layer pattern may be alternatively and repeatedly stacked at least once, and the trapping nitride layer pattern may contain the same metal as that contained in the conductive oxygen trap pattern.

In another aspect, the invention is directed to a method of fabricating an interconnection structure in a semiconductor device. The method includes forming a lower interlayer insulating layer on a semiconductor substrate. A metal layer pattern, a capping layer pattern and an oxygen trap pattern are sequentially stacked on the lower interlayer insulating layer. At this time, the oxygen trap pattern is formed to include a conductive oxygen trap pattern.

In some example embodiments of the invention, an upper interlayer insulating layer may be further formed on the semiconductor substrate having the lower interlayer insulating layer and the oxygen trap pattern. A photoresist pattern having an opening exposing a predetermined region may be formed on the upper interlayer insulating layer. The upper interlayer insulating layer may be etched using the photoresist layer as an etch mask, thereby forming a first via contact hole passing through the interlayer insulating layer. The photoresist layer pattern may be removed by an ashing process. A contact plug electrically connected to the metal layer pattern through the via contact hole may be formed. During the ashing process, the conductive oxygen trap pattern may be converted into a metal oxide layer. The first via contact hole may be formed to expose a top surface of the oxygen trap pattern. Before forming the contact plug, the oxygen trap pattern exposed through the first via contact hole may be etched, thereby forming a second via contact hole exposing a top surface of the capping layer pattern.

BRIEF DESCRIPTION OF THE DRAWINGS

The foregoing and other objects, features and advantages of the invention will become more apparent from the following more particular description of example embodiments of the invention and the accompanying drawings. The drawings are not necessarily to scale, emphasis instead being placed upon illustrating the principles of the invention.

FIGS. 1A to 1C are cross-sectional views illustrating a method of fabricating a conventional interconnection structure.

DETAILED DESCRIPTION OF THE INVENTION

Figure 1A:
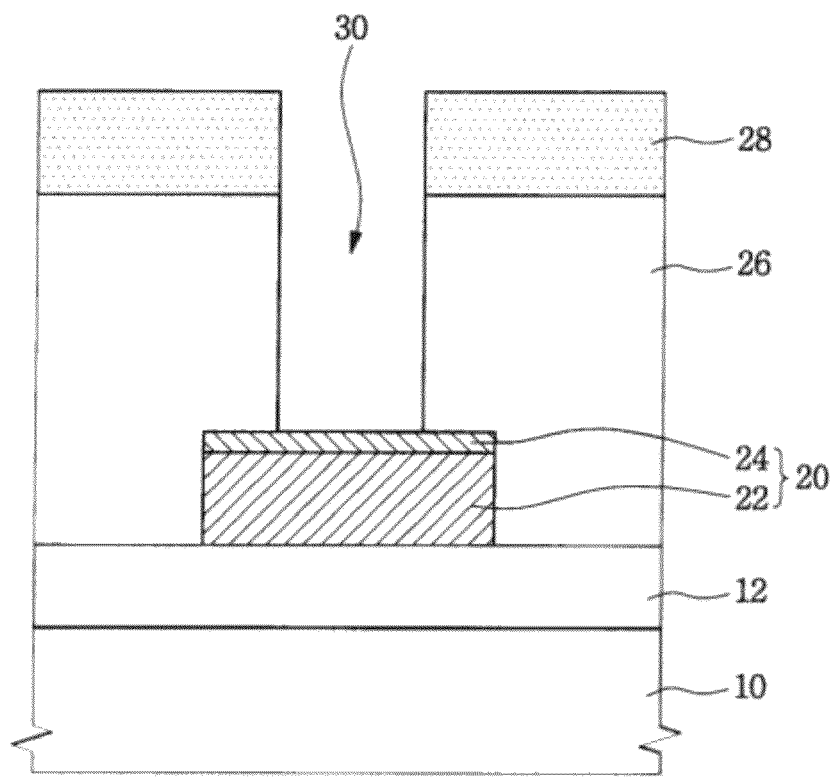
Figure 1C:
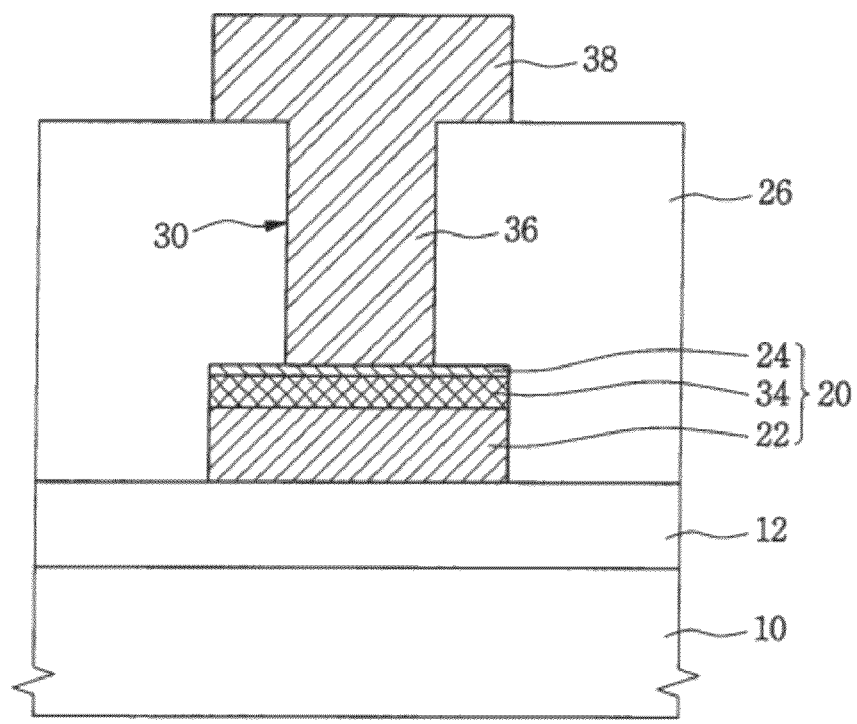

The present invention will now be described more fully hereinafter with reference to the accompanying drawings, in which example embodiments of the invention are shown. This invention may, however, be embodied in different forms and should not be construed as limited to the example embodiments set forth herein. Rather, these example embodiments are provided so that this disclosure will be thorough and complete, and will fully convey the scope of the invention to those skilled in the art. In the drawings, the thicknesses of the layer and regions may be exaggerated for clarity. Like reference numerals denote like elements throughout the specification. In addition, when a layer is described to be formed on other layer or on a substrate, which means that the layer may be formed on the other layer or on the substrate, or a third layer may be interposed between the layer and the other layer or the substrate.

Figure 2A:
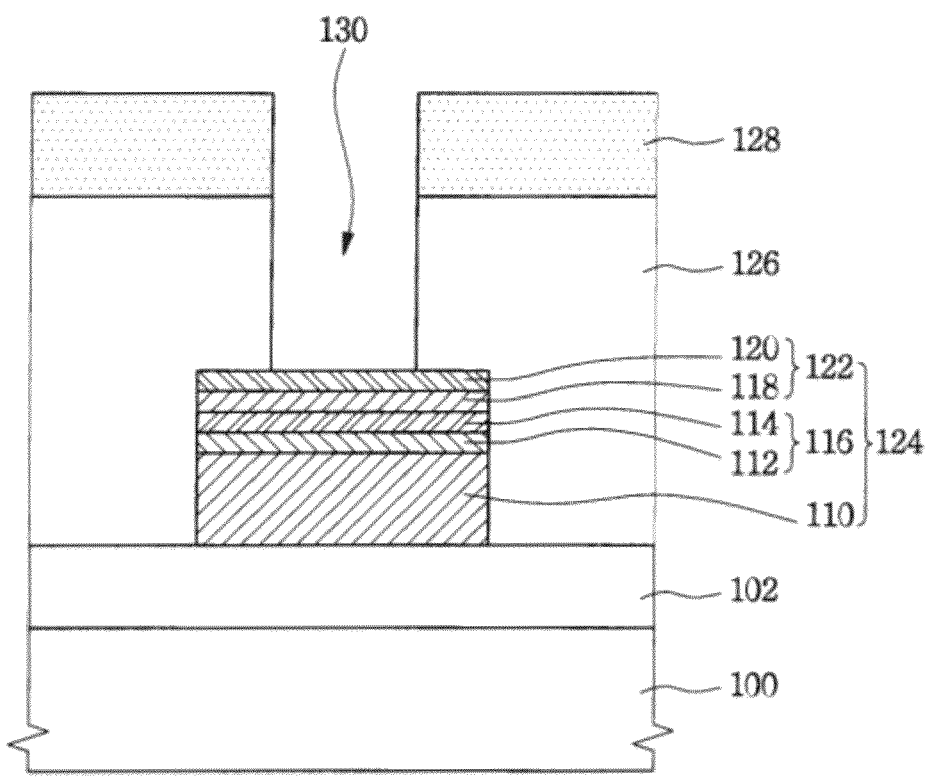
FIGS. 2A to 2C are cross-sectional views illustrating a method of fabricating an interconnection structure in a semiconductor device according to an example embodiment of the present invention.
Figure 2B:
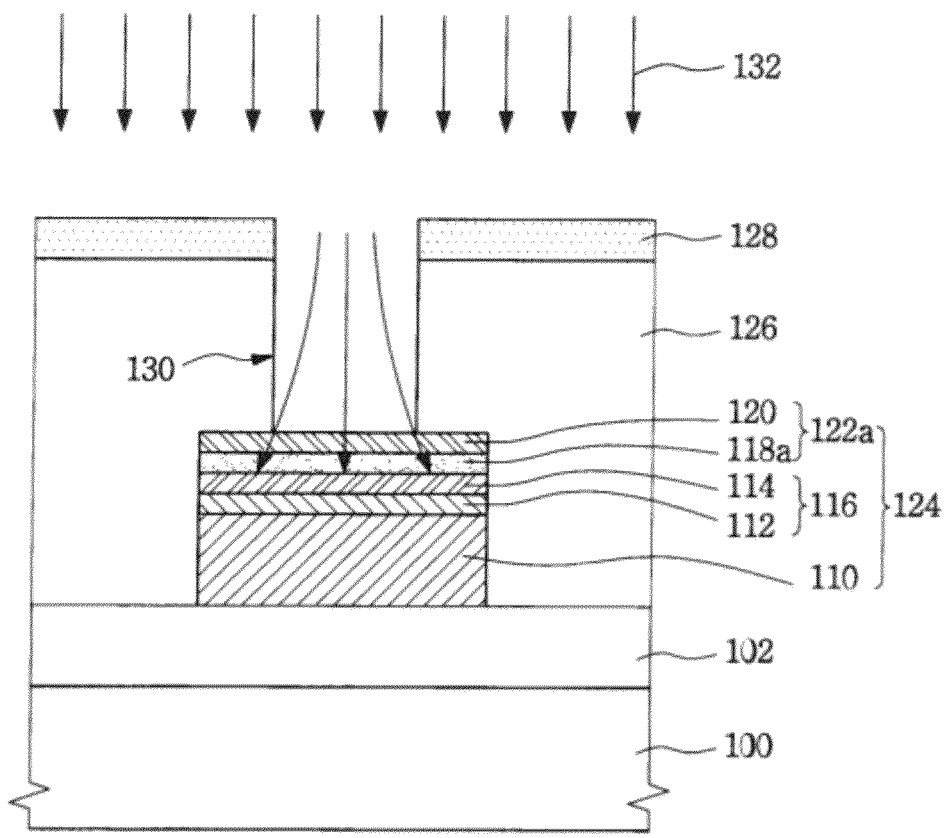
Figure 2C:
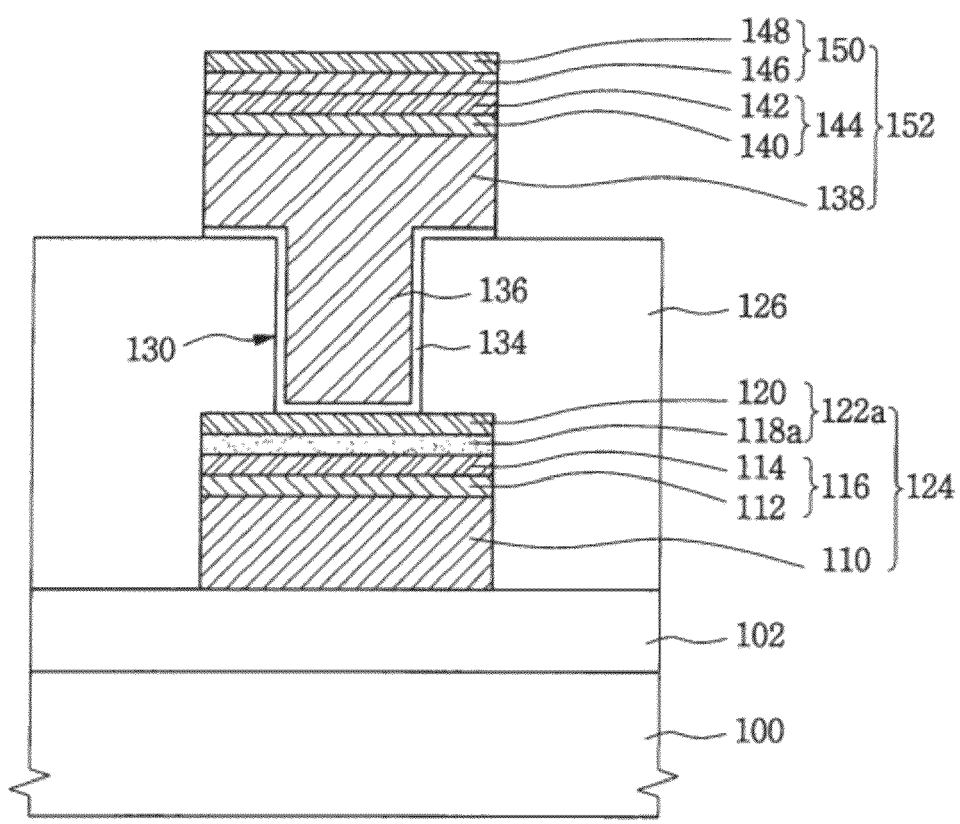

A method of fabricating an interconnection structure in a semiconductor device according to an example embodiment of the present invention will now be described with reference to FIGS. 2A to 2C. FIGS. 2A to 2C are cross-sectional views illustrating a method of fabricating an interconnection structure in a semiconductor device according to an example embodiment of the present invention. The method may be applied to all kinds of semiconductor devices having an interconnection structure, for example, DRAM devices, flash memory devices or phase change memory (PRAM) devices.

Referring to FIG. 2A, the semiconductor substrate 100 may be a bulk substrate or a silicon on insulator (SOI) substrate. The semiconductor substrate 100 may have structures such as a transistor thereon, which however will be omitted for simplicity of description. A lower interlayer insulating layer 102 is formed on the semiconductor substrate 100. The lower interlayer insulating layer 102 may be formed of a silicon oxide layer or an insulating layer having low permittivity.

A lower metal layer, a buffer metal layer, a capping nitride layer, a conductive oxygen trap layer and a trapping nitride layer are sequentially stacked on the lower interlayer insulating layer 102. The lower metal layer may be formed of at least one of aluminum, an aluminum alloy, tungsten and a tungsten alloy. Here, when the lower metal layer is formed of an aluminum alloy, the aluminum alloy may be a mixture of aluminum and a material such as copper (Cu), titanium (Ti), palladium (Pd) or silicon (Si). The aluminum alloy may prevent formation of hillocks in the lower metal layer, and thus electromigration characteristics may be enhanced. Moreover, to improve the electromigration characteristics, a titanium, chromium or tantalum layer may be interposed in the aluminum layer. The lower metal layer formed of the above-mentioned metal may be formed by sputtering or chemical vapor deposition (CVD).

The capping nitride layer may be formed of at least one of titanium nitride, tantalum nitride, tungsten nitride and titanium silicon nitride. Here, since the capping nitride layer has a thermal stress, which is relatively different from the lower metal layer, the buffer metal layer may be interposed between the lower metal layer and the capping nitride layer in order to lessen the stress. The buffer metal layer may be formed to contain substantially the same type of metal as that contained in the capping nitride layer. The capping nitride layer and the buffer metal layer, which are formed of the above-mentioned materials, may be formed by sputtering.

Meanwhile, the conductive oxygen trap layer is a trapping metal layer capable of trapping oxygen due to high reactivity with oxygen, which may be formed of at least one of titanium (Ti), vanadium (Va), chromium (Cr), cobalt (Co), nickel (Ni), hafnium (Hf), tungsten (W), iridium (Ir), platinum (Pt), tantalum (Ta) and tin (Sn). Further, the trapping nitride layer may be formed of a metal nitride layer containing the same type of metal as that contained in the conductive oxygen trap layer. The conductive oxygen trap layer and the trapping nitride layer, which are formed of the above-mentioned materials, may be formed by sputtering. Furthermore, the conductive oxygen trap layer and the trapping nitride layer may be alternatively and repeatedly stacked at least once. The layers formed on the lower metal layer may be formed by an in-situ process.

Subsequently, the lower metal layer, the buffer metal layer, the capping nitride layer, the conductive oxygen trap layer and the trapping nitride layer may be continuously patterned to form a lower metal layer pattern 110, a buffer metal pattern 112, a capping nitride layer pattern 114, a conductive oxygen trap pattern 118 and a trapping nitride layer pattern 120, which are sequentially stacked. As a result, a capping layer pattern 116 comprised of the buffer metal pattern 112 and the capping nitride layer pattern 114 may be formed, and an oxygen trap pattern 122 comprised of the conductive oxygen trap pattern 118 and the trapping nitride layer pattern 120 may be formed. Further, a lower metal interconnection 124 including the lower metal layer pattern 110, the capping layer pattern 116 and the oxygen trap pattern 122, which are sequentially stacked, may be formed.

An upper interlayer insulating layer 126 may then be formed on the semiconductor substrate 100 having the lower metal interconnection 124. The upper interlayer insulating layer 126 may be formed of substantially the same insulating layer as the lower interlayer insulating layer 102. Subsequently, a photoresist pattern 128 having an opening exposing a predetermined region of the upper interlayer insulating layer 126 may be formed. The trapping nitride layer pattern 120 may serve as an anti-reflection coating layer. Then, the upper interlayer insulating layer 126 may be dry-etched using the photoresist pattern 128 as an etch mask. In this case, the trapping nitride layer pattern 120 may be used as an etch stop layer. As a result, a via contact hole 130 exposing a top surface of the trapping nitride layer pattern 120 may be formed. The trapping nitride layer pattern 120 exposed through the via contact hole 130 may suppress excessive oxidation of the conductive oxygen trap pattern 118 by preventing direct exposure of the conductive oxygen trap pattern 118.

Referring to FIG. 2B, the photoresist pattern 128 may be removed by an ashing process. The ashing process may be performed using an oxygen gas 132 or an ozone gas in addition to plasma. At this time, while the oxygen gas 132 may remain in the trapping nitride layer pattern 120, if the trapping nitride layer pattern 120 is formed of titanium nitride, the oxygen gas 132 may penetrate into the conductive oxygen trap pattern 118 along boundaries of vertical grains of the titanium nitride layer. The penetrated oxygen 132 reacts with a metal constituting the conductive oxygen trap pattern 118. Thus, the conductive oxygen trap pattern 118 may be oxidized by trapping the oxygen 132, which as a result is converted into a metal oxide layer. Although the metal oxide layer is formed in the oxidized conductive oxygen trap pattern 118a, the oxidized conductive oxygen trap pattern 118a does not lose conductivity. Meanwhile, since the oxidized conductive oxygen trap pattern 118a has a relatively higher oxygen reactivity than the trapping nitride layer pattern 120 and the capping nitride layer pattern 114, which are disposed on and under the oxidized conductive oxygen trap pattern 118a, respectively, the oxygen 132 may not diffuse into adjacent layers. Further, the oxidized conductive oxygen trap pattern 118a may continuously trap the oxygen 132 in the subsequent annealing process, and thus may prevent the diffusion of the oxygen 132 into the adjacent layers. Accordingly, formation of an oxide layer at an interface between the lower metal layer pattern 110 and the capping layer pattern 116 is prevented. Moreover, the capping nitride layer pattern 114 helps to suppress the diffusion of the oxygen 132, which is not trapped in the oxidized conductive oxygen trap pattern 118a, into the lower metal layer pattern 110.

Referring to FIG. 2C, a barrier metal layer, an upper metal layer, a buffer metal layer, a capping nitride layer, a conductive oxygen trap layer, and a trapping nitride layer may be sequentially stacked on the entire surface of the semiconductor substrate 100 having the via contact hole 130. The barrier metal layer may be formed of at least one of titanium nitride, tantalum nitride, tungsten nitride and titanium silicon nitride. The layers other than the barrier metal layer may be formed of the same material as described in FIG. 2A. Since the layers are stacked, the upper metal layer may form a contact plug 136 electrically in contact with an oxidized oxygen trap pattern 122a by filling the via contact hole 130. Meanwhile, the capping layer pattern 116 suppresses infiltration of by-products generated in a deposition process of the layers such that the by-products do not diffuse into the lower metal layer pattern 110.

Subsequently, the stacked layers may be sequentially patterned to form a barrier metal layer pattern 134, an upper metal layer pattern 138, a buffer metal pattern 140, a capping nitride layer pattern 142, a conductive oxygen trap pattern 146 and a trapping nitride layer pattern 148, which are sequentially stacked. As a result, an upper capping layer pattern 144 including the buffer metal pattern 140 and the capping nitride layer pattern 142 may be formed. In addition, an upper oxygen trap pattern 150 including the conductive oxygen trap pattern 146 and the trapping nitride layer pattern 148 may be formed. Accordingly, an upper metal interconnection 152 comprised of the upper metal layer pattern 138, the upper capping layer pattern 144 and the upper oxygen trap pattern 150, which are sequentially stacked, may be formed.

According to the present example embodiment, the conductive oxygen trap pattern 118 suppresses the diffusion of oxygen into the lower metal layer pattern 110 by trapping the oxygen generated in the ashing process or the subsequent annealing process. Further, the metal oxide layer in the oxidized conductive oxygen trap pattern 118a has a relatively lower resistance than the conventional oxide layer formed at the interface. For example, when the lower metal layer pattern 110, the buffer metal pattern 112 and the capping nitride layer pattern 114 are formed of aluminum, titanium and titanium nitride, respectively, an aluminum titanium oxide layer may be formed at an interface between the lower metal layer pattern 110 and the buffer metal pattern 112 according to the conventional method. Conversely, when the conductive oxygen trap pattern 118 is formed of titanium, a titanium oxide layer may be formed in the oxidized conductive oxygen trap pattern 118a in the present example embodiment. Since the titanium oxide layer has a lower resistance than the aluminum titanium oxide layer, contact resistance between the contact formed in the via contact hole 130 and the lower metal interconnection 124 may decrease.

An interconnection structure in a semiconductor device according an example embodiment of the present invention will now be described with reference to FIG. 2C. A lower interlayer insulating layer 102 is disposed on the semiconductor substrate 100. Component structures such as transistors may be formed on the semiconductor substrate 100. A lower metal interconnection 124 may be formed on the lower interlayer insulating layer 102. The lower metal interconnection 124 may include a lower metal layer pattern 110, a capping layer pattern 116 and an oxidized oxygen trap pattern 122a, which are sequentially stacked. The lower metal layer pattern 110 may be formed of the metal layer described above with reference to FIG. 2A, which will not be described any further for the sake of brevity. The capping layer pattern 116 may include a buffer metal pattern 112 and a capping nitride layer pattern 114, which are sequentially stacked. Material layers comprising these patterns may be the same as those described with reference to FIG. 2A, and therefore a detailed description of their function and composition will be omitted for brevity. The oxidized oxygen trap pattern 122a may include an oxidized conductive oxygen trap pattern 118a and a trapping nitride layer pattern 120, which are sequentially stacked. The oxidized conductive oxygen trap pattern 118a may react with oxygen to form a metal layer capable of trapping oxygen. The oxidized conductive oxygen trap pattern 118a may include a metal oxide layer formed during the fabrication process therein, as described above. Material layers comprising the oxidized conductive oxygen trap pattern 118a and the trapping nitride layer pattern 120 may be the same as those described with reference to FIG. 2A, and therefore a detailed description of their function and composition will be omitted for brevity. In addition, the oxidized conductive oxygen trap pattern 118a and the trapping nitride layer pattern 120 may be alternatively and repeatedly stacked at least once.

An upper interlayer insulating layer 126 having a via contact hole 130 may be formed on the semiconductor substrate 100 having the lower metal interconnection 124. At this time, the via contact hole 130 may expose a top surface of the trapping nitride layer pattern 120.

A barrier metal layer pattern 134 and a contact plug 136 are sequentially stacked while filling the via contact hole 130. An upper metal interconnection 152 is disposed on the contact plug 136. The upper metal interconnection 152 may include an upper metal layer pattern 138, an upper capping layer pattern 144 and an upper oxygen trap pattern 150, which are sequentially stacked. The upper metal layer pattern 138 may be formed of the metal layer described with reference to the fabrication method of FIG. 2C, which will not be explained any further for the sake of brevity. The upper capping layer pattern 144 may include a buffer metal pattern 140 and a capping nitride layer pattern 142, which are sequentially stacked. Material layers comprising these patterns may be the same as those described with reference to the fabrication method of FIG. 2A, and therefore a detailed description of their function and composition will be omitted for brevity. The upper oxygen trap pattern 150 may include a conductive oxygen trap pattern 146 and a trapping nitride layer pattern 148, which are sequentially stacked.

According to the present example embodiment, the resistance increase of the lower metal interconnection 124 may be suppressed by preventing the formation of the oxide layer in the lower metal layer pattern 110. Further, as described with reference to the fabrication method of FIG. 2C, the metal oxide layer in the oxidized conductive oxygen trap pattern 118a has a relatively lower resistance than the conventional oxide layer formed at the interface. Thus, the reliability of the semiconductor device is enhanced.

A method of fabricating an interconnection structure in a semiconductor device according to another example embodiment of the present invention will now be described with reference to FIGS. 3A to 3D. FIGS. 3A to 3D are cross-sectional views illustrating a method of fabricating an interconnection structure in a semiconductor device according to another example embodiment of the present invention.

Figure 3A:
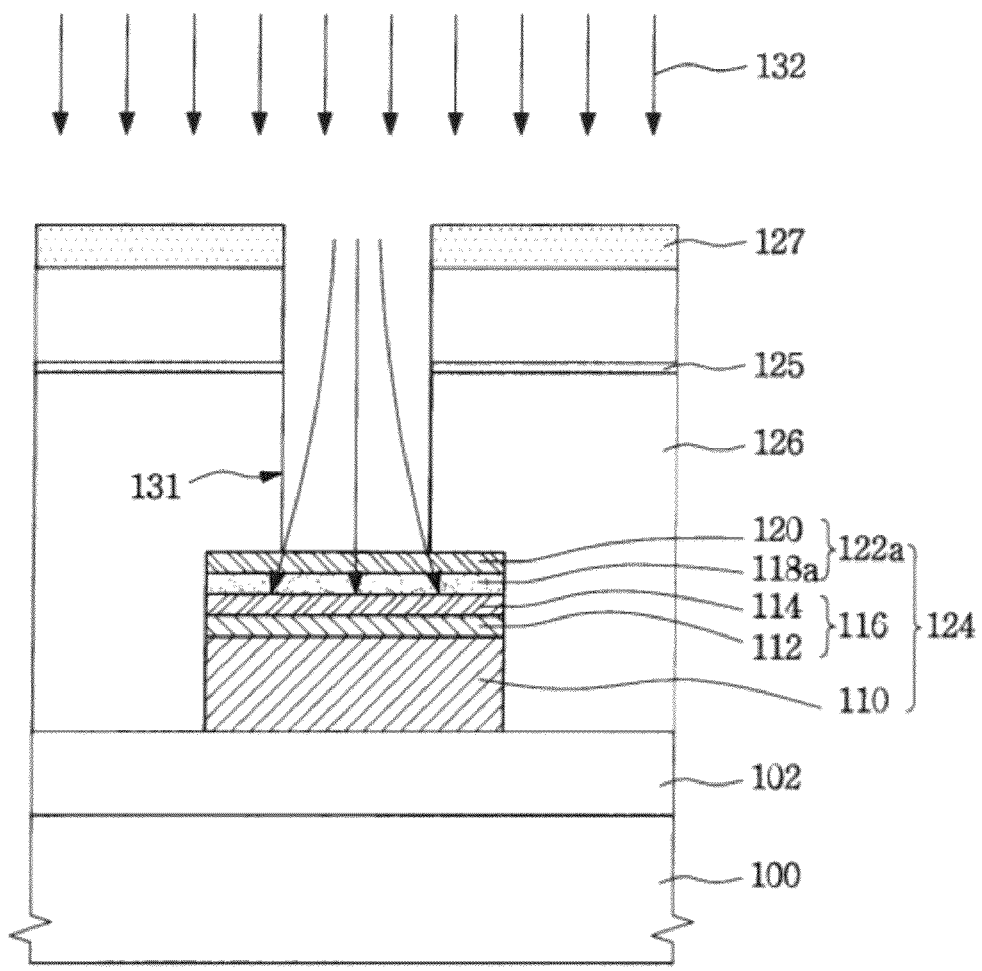
FIGS. 3A to 3D are cross-sectional views illustrating a method of fabricating an interconnection structure in a semiconductor device according to another example embodiment of the present invention.

Referring to FIG. 3A, a lower interlayer insulating layer 102 is formed on a semiconductor substrate 100. A lower metal interconnection 124 is formed on the lower interlayer insulating layer 102. The lower metal interconnection 124 may include a lower metal layer pattern 110, a capping layer pattern 116 and an oxygen trap pattern 122, which are sequentially stacked. The lower metal layer pattern 110 may be formed of the metal layer described with reference to FIG. 2A, which will not be explained any further for the sake of brevity. The capping layer pattern 116 may include a buffer metal pattern 112 and a capping nitride layer pattern 114, which are sequentially stacked. Material layers comprising these patterns may be the same as those described with reference to FIG. 2A, and therefore a detailed description of their function and composition will be omitted for brevity. The oxygen trap pattern 122 may include a conductive oxygen trap pattern 118 and a trapping nitride layer pattern 120, which are sequentially stacked. The conductive oxygen trap pattern 118 may be formed of a metal layer which can trap oxygen by reacting with the oxygen. Material layers comprising the conductive oxygen trap pattern 118 and the trapping nitride layer pattern 120 may be the same as those described with reference to FIG. 2A, and therefore a detailed description of their function and composition will be omitted for brevity. Also, the conductive oxygen trap pattern 118 and the trapping nitride layer pattern 120 may be alternatively and repeatedly stacked. A detailed fabrication process for the lower metal interconnection 124 may be performed in the same manner as described with reference to FIG. 2A.

An upper interlayer insulating layer 126 may be formed on the semiconductor substrate 100 having the lower metal interconnection 124. At this time, an etch stop layer 125 may be disposed in the upper interlayer insulating layer 126, and the etch stop layer 125 may be an insulating layer having an etch selectivity to the upper interlayer insulating layer 126, for example, a silicon nitride layer. Then, a first photoresist pattern 127 having an opening exposing a predetermined region may be formed on the upper interlayer insulating layer 126. The trapping nitride layer pattern 120 may serve as an etch stop layer. As a result, the upper interlayer insulating layer 126 and the etch stop layer 125 may be etched using the first photoresist pattern 127 as an etch mask. Thus, a preliminary via contact hole 131 exposing a top surface of the trapping nitride layer pattern 120 may be formed. The trapping nitride layer pattern 120 exposed through the preliminary via contact hole 131 suppresses excessive oxidization of the conductive oxygen trap pattern 118 by preventing direct exposure of the conductive oxygen trap pattern 118.

Subsequently, the first photoresist pattern 127 may be removed by an ashing process. At this time, as described with reference to FIG. 2B, an oxygen gas 132 used in the ashing process may penetrate into the conductive oxygen trap pattern 118. Accordingly, the conductive oxygen trap pattern 118 may be oxidized by trapping the oxygen 132, which thus is converted into a metal oxide layer. Even if the metal oxide layer is formed in the oxidized conductive oxygen trap pattern 118a, the oxidized conductive oxygen trap pattern 118a does not lose conductivity. Also, the oxidized conductive oxygen trap pattern 118a does not allow the oxygen to diffuse into adjacent layers. Thus, formation of the oxide layer at the interface between the capping layer pattern 116 and the lower metal layer pattern 110 during the ashing process or the subsequent annealing process may be prevented.

Figure 3B:
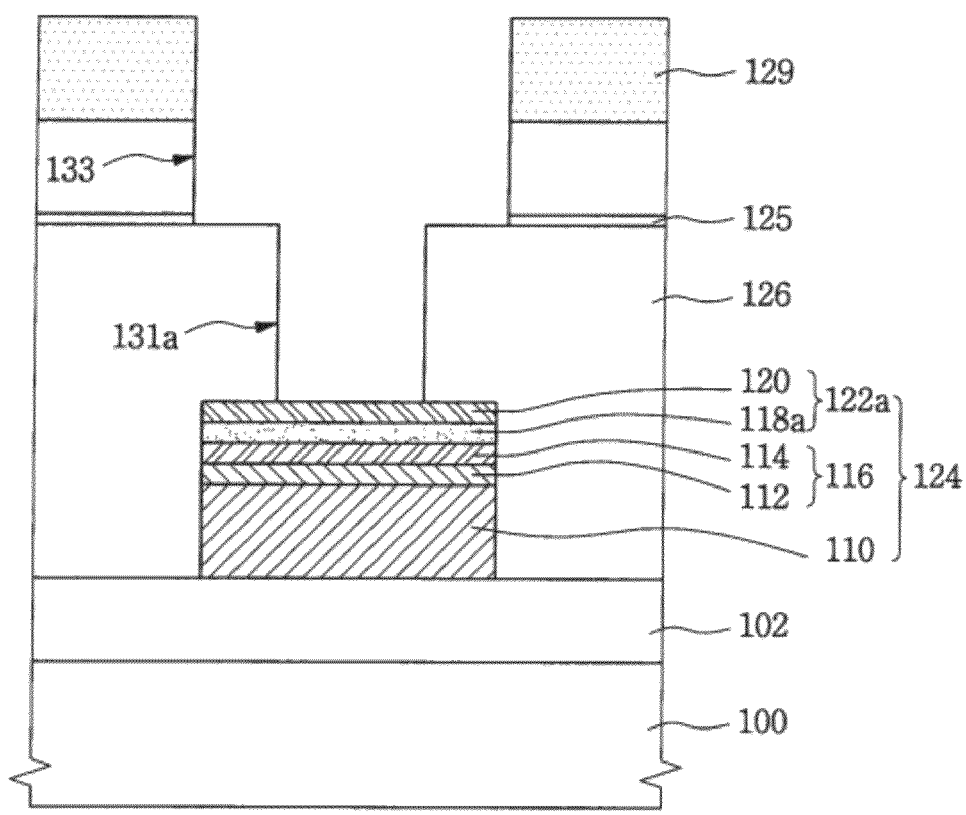

Referring to FIG. 3B, a second photoresist pattern 129 having a line-shaped opening may be formed on the upper interlayer insulating layer 126. The upper interlayer insulating layer 126 may be etched using the second photoresist pattern 129 as an etch mask. At this time, the etching of the upper interlayer insulating layer 126 may be stopped by the etch stop layer 125. Thereafter, the etch stop layer 125 may be etched. As a result, a line-shaped trench 133 may be formed, and a first via contact hole 131a may be formed thereunder. A width of the line-shaped trench 133 may be larger than a diameter of the first via contact hole 131a. Meanwhile, by-products generated during the formation of the first via contact hole 131a and the trench 133 may not diffuse into the lower metal layer pattern 110 due to the capping layer pattern 116.

Figure 3C:
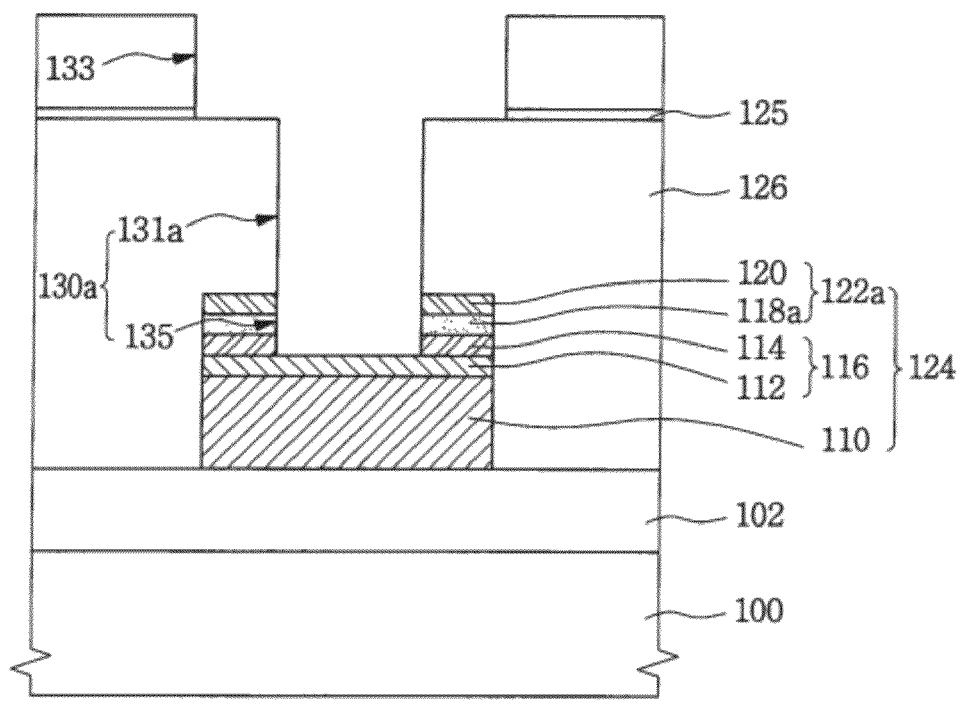

Referring to FIG. 3C, the second photoresist pattern 129 may be removed by the ashing process. Here, as described with reference to FIG. 3A, the oxidized conductive oxygen trap pattern 118a may trap the oxygen used in the ashing process.

Subsequently, the trapping nitride layer pattern 120, the oxidized conductive oxygen trap pattern 118a and the capping nitride layer pattern 114, which are exposed through the first via contact hole 130, may be sequentially etched. As a result, a second via contact hole 135 exposing a top surface of the buffer metal pattern 112, and having substantially a same diameter as the first via contact hole 131 a, may be formed. Consequently, a via contact hole 130a including the first and second via contact holes 131 a and 135 may be completed.

Figure 3D:
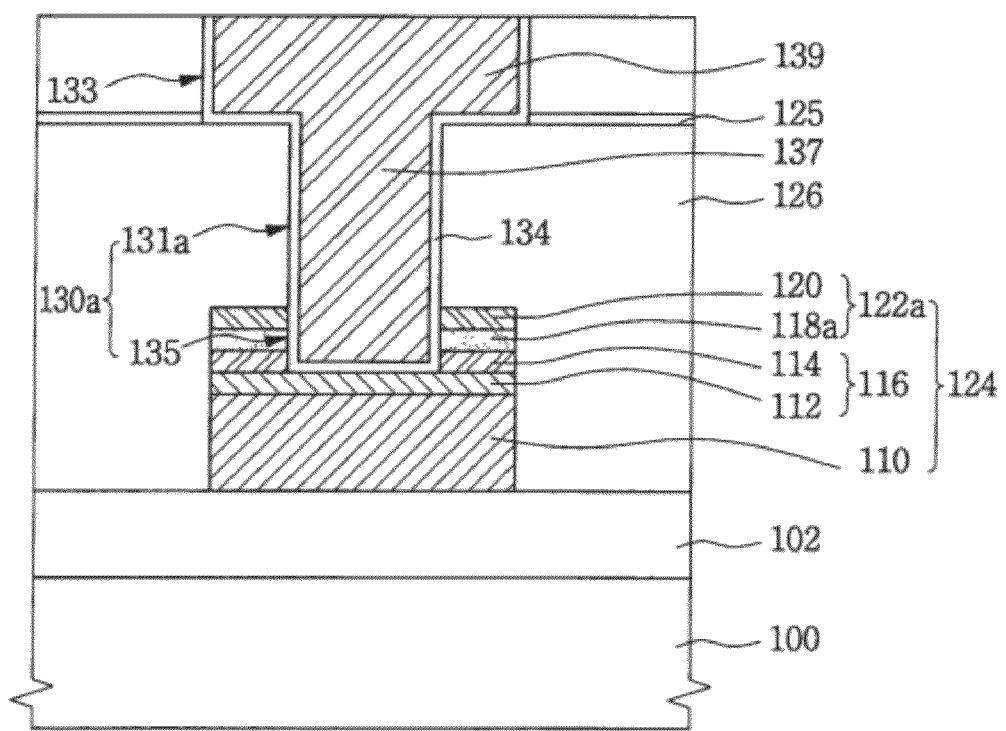

Referring to FIG. 3D, a barrier metal layer and an upper metal layer may be deposited on the entire surface of the semiconductor substrate 100 having the trench 133 and the via contact hole 130a. The barrier metal layer may be formed of at least one of titanium nitride, tantalum nitride, tungsten nitride and titanium silicon nitride, and the upper metal layer may be formed of copper or tungsten. Subsequently, the upper metal layer and the barrier metal layer may be planarized using a top surface of the upper interlayer insulating layer 126 as a stop layer. The planarization process may be performed by a chemical mechanical polishing (CMP) technique, which is well known in the art. As a result, a contact plug 137 may be formed in the via contact hole 130a, and an upper metal layer pattern 139 may be formed in the trench 133. Here, the upper metal layer pattern 139 may be used as an upper metal interconnection. In addition, a barrier metal layer pattern 134 may be interposed between the contact plug 137 and the upper interlayer insulating layer 126, and between the metal layer pattern 139 and the upper interlayer insulating layer 126.

In the present example embodiment, the conductive oxygen trap pattern 118 traps the oxygen penetrating thereinto during the fabrication process, thereby reducing contact resistance between the lower metal layer pattern 110 and the contact plug 137. Further, the contact plug 137 is electrically in contact with the buffer metal pattern 112, and thus has a relatively lower contact resistance than that in the example embodiment described with reference to FIG. 2C.

An interconnection structure in a semiconductor device according to another example embodiment of the present invention will now be described with reference to FIG. 3D. A lower interlayer insulating layer 102 is disposed on a semiconductor substrate 100. A lower metal interconnection 124 may be formed on the lower interlayer insulating layer 102. The lower metal interconnection 124 may include a lower metal layer pattern 110, a capping layer pattern 116 and an oxidized oxygen trap pattern 122a, which are sequentially stacked. The capping layer pattern 116 may include a buffer metal pattern 112 and a capping nitride layer pattern 114, which are sequentially stacked. The oxidized oxygen trap pattern 122a may include an oxidized conductive oxygen trap pattern 118a and a trapping nitride layer pattern 120, which are sequentially stacked. The oxidized conductive oxygen trap pattern 118a may be formed of an oxygen and a metal layer which can trap oxygen by reacting with the oxygen.

A via contact hole 130a may be formed on the semiconductor substrate 100 having the lower metal interconnection 124. Further, the via contact hole 130a may be formed in an upper interlayer insulating layer 126 having a line-shaped trench 133 formed thereon. Here, the via contact hole 130a may expose a top surface of the buffer metal pattern 112. A contact plug 137 and an upper metal layer pattern 139 are sequentially stacked while filling the via contact hole 130a and the trench 133. The upper metal layer pattern 139 may be used as an upper metal interconnection.

According to example embodiments of the present invention, an interconnection having a metal layer pattern may include an oxygen trap pattern formed on the metal layer pattern. The oxygen trap pattern is formed to include a conductive oxygen trap pattern, and the conductive oxygen trap pattern is formed to have a metal layer capable of reacting with oxygen. Thus, the conductive oxygen trap pattern may trap oxygen during formation of the via contact hole to form a contact plug on a predetermined region of the interconnection, thereby preventing the diffusion of the oxygen to the metal layer pattern. Accordingly, contact resistance between the contact plug and the interconnection may decrease, and the reliability of a semiconductor device is enhanced.

In addition, the via contact hole may expose a top surface of a capping layer pattern interposed between the oxygen trap pattern and the metal layer pattern, so that the contact plug can contact the capping layer pattern. Thus, contact resistance between the contact plug and the metal layer pattern may further decrease.

Example embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An interconnection structure in a semiconductor device, comprising:
    a lower interlayer insulating layer formed on a semiconductor substrate;
    a metal layer pattern and a capping layer pattern sequentially stacked on the lower interlayer insulating layer; and
    an oxygen trap pattern disposed on the capping layer pattern and including a conductive oxygen trap pattern,
    wherein the conductive oxygen trap pattern includes at least one of vanadium, chromium, cobalt, nickel, hafnium, tungsten, iridium, platinum, tantalum and tin (Sn),
    wherein the capping layer pattern includes a capping nitride layer pattern, and wherein the capping nitride layer pattern includes at least one of a titanium nitride layer, a tantalum nitride layer, a tungsten nitride layer and a titanium silicon nitride layer.

2. The interconnection structure according to claim 1, wherein the conductive oxygen trap pattern includes a layer of metal structured to trap oxygen by reacting with the oxygen.

3. The interconnection structure according to claim 2, wherein the oxygen trap pattern includes a trapping nitride layer pattern disposed on the conductive oxygen trap pattern, and
    wherein the conductive oxygen trap pattern and the trapping nitride layer pattern are alternatively and repeatedly stacked at least once.

4. The interconnection structure according to claim 1, wherein the capping layer pattern further includes a buffer metal pattern interposed between the metal layer pattern and the capping nitride layer pattern, and wherein the buffer metal pattern contains substantially the same metal as that contained in the capping nitride layer pattern.

5. The interconnection structure according to claim 1, wherein the metal layer pattern includes at least one of an aluminum layer, an aluminum alloy layer, a tungsten layer and a tungsten alloy layer.

6. The interconnection structure according to claim 1, further comprising:
    an upper interlayer insulating layer disposed on the semiconductor substrate having the lower interlayer insulating layer and the oxygen trap pattern; and
    a contact plug electrically coupled to the metal layer pattern through a via contact hole passing through the upper interlayer insulating layer, wherein the conductive oxygen trap pattern includes a metal oxide.

7. The interconnection structure according to claim 6, wherein the via contact hole exposes a top surface of the oxygen trap pattern.

8. The interconnection structure according to claim 6, wherein the capping layer pattern includes the capping nitride layer pattern and a buffer metal pattern, and wherein the via contact hole exposes a top surface of the buffer metal pattern.

9. The interconnection structure according to claim 6, further comprising a barrier metal layer pattern provided along sidewalls and a bottom surface of the via contact hole.

10. An interconnection structure in a semiconductor device, comprising:
   a lower interlayer insulating layer formed on a semiconductor substrate;
   a lower metal layer pattern formed on a portion of the lower interlayer insulating layer;
   a capping layer pattern disposed on the lower metal layer pattern;
   an oxygen trap pattern disposed on the capping layer pattern and including a metal oxide pattern,
   an upper interlayer insulating layer disposed on portions of the oxygen trap pattern and the lower interlayer insulating layer; and
   an opening in the upper interlayer insulating layer exposing a portion of a top surface of the oxygen trap pattern,
   wherein the oxygen trap pattern includes a trapping nitride layer pattern disposed on the metal oxide pattern,
   wherein the oxygen trap pattern has a higher oxygen reactivity than the trapping nitride layer pattern, and
   wherein the oxygen trap pattern is structured to trap oxygen by reacting with the oxygen responsive to a formation of the opening.

11. The interconnection structure according to claim 10, further comprising:
   a contact plug electrically coupled to the lower metal layer pattern through the opening, wherein the opening is a via contact hole passing through the upper interlayer insulating layer; and
   an upper metal layer pattern disposed on portions of an upper surface of the upper interlayer insulating layer and electrically coupled to the contact plug, the upper metal layer pattern having the form of a line.

12. The interconnection structure according to claim 11, further comprising a barrier metal layer pattern interposed between the contact plug and the upper interlayer insulating layer, and interposed between the upper metal layer pattern and the upper interlayer insulating layer.

13. The interconnection structure according to claim 12, further comprising:
   an upper capping layer pattern disposed on the upper metal layer pattern; and
   an upper oxygen trap pattern disposed on the upper capping layer pattern, wherein the upper oxygen trap pattern is structured to trap oxygen by reacting with the oxygen.

14. An interconnection structure in a semiconductor device, comprising:
   a lower interlayer insulating layer formed on a semiconductor substrate;
   a lower metal layer pattern formed on a portion of the lower interlayer insulating layer;
   a capping layer pattern disposed on the lower metal layer pattern;
   an oxygen trap pattern disposed on the capping layer pattern and including a metal oxide pattern,
   wherein the capping layer pattern includes a capping nitride layer pattern disposed on a buffer metal pattern,
   wherein the metal oxide pattern has a higher oxygen reactivity than the capping nitride layer, and
   wherein the buffer metal pattern is disposed on the lower metal layer pattern.

15. The interconnection structure according to claim 14, further comprising:
   an upper interlayer insulating layer disposed on portions of the oxygen trap pattern and the lower interlayer insulating layer; and
   an opening in the upper interlayer insulating layer exposing a portion of a top surface of the buffer metal pattern.

16. An interconnection structure in a semiconductor device, comprising:
   a lower interlayer insulating layer on a semiconductor substrate;
   a lower metal layer on a portion of the lower interlayer insulating layer;
   a buffer metal layer located on the lower metal layer, the buffer metal layer including a first metal;
   a capping nitride layer on the buffer metal layer, the capping nitride layer including a first metal nitride;
   a conductive oxygen trap layer on the capping nitride layer, the oxygen trap layer including a second metal different from the first metal; and
   a trap nitride layer on the conductive oxygen trap layer, the trap nitride layer including a second metal nitride,
   wherein the conductive oxygen trap layer has a higher oxygen reactivity than the trap nitride layer and the capping nitride layer.

17. The interconnection structure according to claim 16, wherein the first metal includes titanium,
   wherein the first metal nitride and the second metal nitride include titanium nitride, and
   wherein the second metal includes at least one of vanadium, chromium, cobalt, nickel, hafnium, tungsten, iridium, a platinum, a tantalum and tin (Sn).

* * * * *